(12) United States Patent
Xiang et al.

(10) Patent No.: US 7,051,302 B2
(45) Date of Patent: May 23, 2006

(54) METHOD FOR REDUCING PIN OVERHEAD IN NON-SCAN DESIGN FOR TESTABILITY

(75) Inventors: Dong Xiang, Beijing (CN); Jiaguang Sun, Beijing (CN)

(73) Assignee: Tsinghua University, Beijing (CN)

( * ) Notice: Subject to any disclaimer, the term of this patent is extended or adjusted under 35 U.S.C. 154(b) by 160 days.

(21) Appl. No.: 10/703,936

(22) Filed: Nov. 7, 2003

(65) Prior Publication Data

US 2004/0130313 A1      Jul. 8, 2004

(30) Foreign Application Priority Data

Nov. 8, 2002   (CN)   .............................. 02146776 A

(51) Int. Cl.
*G06F 17/50*   (2006.01)
(52) U.S. Cl. .................... 716/4; 716/5; 716/6
(58) Field of Classification Search .............. 716/1, 716/3, 4–6, 18; 714/724, 726; 324/763–765; 702/123; 703/13–22
See application file for complete search history.

(56) References Cited

U.S. PATENT DOCUMENTS

| | | | | |
|---|---|---|---|---|
| 5,754,454 A | * | 5/1998 | Pixley et al. ................ | 702/123 |
| 5,898,703 A | * | 4/1999 | Lin ............................. | 714/726 |
| 6,275,963 B1 | * | 8/2001 | Maeno et al. ................ | 714/726 |
| 6,311,317 B1 | * | 10/2001 | Khoche et al. ............... | 716/18 |
| 6,597,191 B1 | * | 7/2003 | Oosawa et al. ............. | 324/763 |

OTHER PUBLICATIONS

Xiang et al., "Cost-Effective Non-Scan Design for Testability for Actual Testability Improvement," IEEE, Sep. 23-26, 2001, pp. 154-159.*
Xiang et al., "Non-Scan Design for Testability for Synchronous Sequential Circuits Based On Conflict Analysis," IEEE, Oct. 3-5, 2000, pp. 1-6.*
Xiang et al., "Non-Scan Design for Testability Based on Fault Oriented Conflict Analysis," IEEE, Nov. 18-20, 2002, pp. 1063-1075.*
Xiang et al., "Non-Scan Design for Testability for Synchronous Sequential Circuits Based on Conflict Resolution," IEEE, Aug. 8-26, 2003, pp. 520-529.*

(Continued)

*Primary Examiner*—Vuthe Siek
(74) *Attorney, Agent, or Firm*—Schmeiser, Olsen & Watts

(57) ABSTRACT

A method and apparatus for reducing pin overhead in a non-scan design for testability, The method comprises connecting control signals of test points $l_1 \pounds \neg l_2 \pounds \neg, \ldots, \pounds \neg l_h$ to a first primary input $PI_1$ through AND gate switch, connecting control signals of test points $l_j, \ldots, \pounds \neg l_q$ to a kth primary input $PI_k$ through AND gate switch until every test point is connected to one of the primary inputs $PI_1, PI_2, \ldots, PI_k$, connecting a 1-control point to AND gate directly, connecting a 0-control point to AND gate through inverter, sharing one AND gate among all control points that are connected to the same primary input, controlling all control points by an uniform test signal, and checking whether the test points and the primary inputs produce new re-convergent fan-out while reducing inputs of the control signals.

10 Claims, 9 Drawing Sheets

OTHER PUBLICATIONS

E.B. Eichelberger et al., "A Logic Design Structure for LSI Testability", pp. 463-468.

Fidel Muradali et al., "A Self-Driven Test Structure for Pseudorandom Testing of Non-Scan Sequential Circuits", 1996 IEEE, pp. 17-25.

Elizabeth M. Rudnick, et al., An Observability Enhancement Approach for Improved Testability and At-Speed Test, 1994 IEEE, pp. 1051-1056.

Indradeep Ghosh et al., "Design for Heirarchical Testability of RTL Circuits Obtained by Behavioral Synthesis", 1997 IEEE, vol. 16, No. 9, pp. 1001-1014.

Irith Pomeranz et al., Electrical and Computer Engineering Department, University of Iowa, "Design-for-Testability for Path Delay Faults in Large Combinational Circuits Using Test-Points", 7 pgs.

Hsing-Chung Liang et al., "An Effective Methodology for Mixed Scan and Reset Design Based on Test Generation and Structure of Sequential Circuits," 6 pgs.

Dong Xiang et al., "Handling the Pin Overhead Problem of DFT's for High-Quality and At-Speed Tests", 2002 IEEE, vol. 21, No. 9, pp. 1105-1113.

Sujit Dey et al., "Nonscan Design-for-Testability Techniques Using RT-Level Design Information", 1997 IEEE, vol. 16, No. 12, pp. 1488-1506.

Huan-Chih et al., "On Improving Test Quality of Scan-Based BIST", 2000 IEEE, vol. 19, No. 8, pp. 928-938.

Elizabeth M. Rudnick et al., "Sequential Circuit Testability Enhancement Using Nonscan Approach", 1995 IEEE, vol. 3, No. 2, pp. 333-338.

Nur A. Touba et al., "Test Point Insertion Based on Path Tracing", 1996 IEEE, 14th VLSI Test Symposium, pp. 2-8.

Chih-Chang Lin et al., "Test-Point Insertion: Scan Paths Through Functional Logic", 1998 IEEE vol. 17, No. 9, pp. 838-851.

Peter C. Maxwell et al., "The Effect of Different Test Sets on Quality Level Prediction: When is 80% Better than 90%?", International Test Conference 1991 IEEE, pp. 358-364.

* cited by examiner

METHOD FOR REDUCING PIN OVERHEAD IN NON-SCAN DESIGN FOR TESTABILITY

FIELD OF THE INVENTION

The present invention relates to IC design for testability. More particularly, the present invention relates to reducing pin overhead in non-scan design for testability.

BACKGROUND OF THE INVENTION

Since every test pattern used in non-scan design circuit only needs one test cycle in testing, and non-scan design for testability provides an at-speed testing method, the method of non-scan design has gained attention from both academy and industry.

FIG. 1 shows the conventional test point structure. In particular, FIG. 1(a) shows an original circuit; FIG. 1(b) shows insertion of observation points; FIG. 1(c) shows insertion of 1-control point; and FIG. 1(d) shows the insertion of 0-control point.

The pin overhead in non-scan design has remained an unsolved problem for a long time and the previous methods cannot solve it successfully. Currently there are 6 methods to handle the pin overhead problem, but none of them can bring about a satisfactory result. These 6 methods are:

(1) doing nothing to the extra control signal, which leads to a strict restriction on the number of control points and cannot improve testability to a great extent;

(2) connecting the control points to an extra register, when loading the test pattern, the value to be assigned to control point is shifted into the register. However, the method needs multiple clock cycles to load the test pattern for control points.

(3) controlling all control points with one control signal. Almost all reset design methods have chosen this strategy, but testability improvement based on this technique is limited.

(4) setting the control signal of control points to non-controlling values in functional mode and to the controlling values in test mode. This method makes many detectable faults undetectable and hence can not improve the testability of circuit.

(5) using test multi-plexers to improve testability of circuit and all test multi-plexers are controlled by a single control signal, which is similar to method (3). Though it can improve the testability of some signal lines, many fault propagation paths are blocked, hence it cannot really improve testability of the whole circuit.

(6) connecting an observation point and a primary output (PO) to a multiplexer, which makes the fault that must be observed via this PO unobservable.

Therefore, the pin overhead in non-scan design is a very hard problem and needs to be solved as soon as possible.

SUMMARY OF THE INVENTION

A method and apparatus for reducing pin overhead in a non-scan design for testability is disclosed. In one embodiment, the method comprises: connecting control signals of test points $l_1, l_2, \ldots, l_h$ to a first primary input $PI_1$ through AND gate switch, connecting control signals of test points $l_j, \ldots, l_q$ to a second primary input $PI_2$ through AND gate switch until every test point is connected to either primary inputs $PI_1$ or $PI_2$, connecting a 1-control point to AND gate directly, connecting a 0-control point to AND gate through inverter, sharing one AND gate among all control points that are connected to the same primary input, controlling all control points by an uniform signal test, and checking whether the test points and the primary inputs produce new re-convergent fan-out while reducing inputs of the control signals. In another embodiment, the apparatus comprises: means for connecting control signals of test points $l_1, l_2, \ldots, l_h$ to a first primary input $PI_1$ through AND gate switch, means for connecting control signals of test points $l_j, \ldots, l_q$ to a second primary input $PI_2$ through AND gate switch until every test point is connected to either primary inputs $PI_1$ or $PI_2$, means for connecting a 1-control point to AND gate directly, means for connecting a 0-control point to AND gate through inverter, means for sharing one AND gate among all control points that are connected to the same primary input, means for controlling all control points by an uniform signal test, and means for checking whether the test points and the primary inputs produce new re-convergent fan-out while reducing inputs of the control signals.

Other features and advantages of the present invention will be apparent from the accompanying drawings and from the detailed description, which follows below.

BRIEF DESCRIPTION OF THE DRAWINGS

The present invention is illustrated by way of example and not intended to be limited by the figures of the accompanying drawings in which like references indicate similar elements and in which:

FIG. 9 is a diagram showing improvements on testability of circuit S9234.1 when different test points are inserted in.

FIG. 10 is a diagram showing improvements on testability of circuit S13207.1 when different test points are inserted in.

DETAILED DESCRIPTION OF THE DRAWINGS

Figure 1:
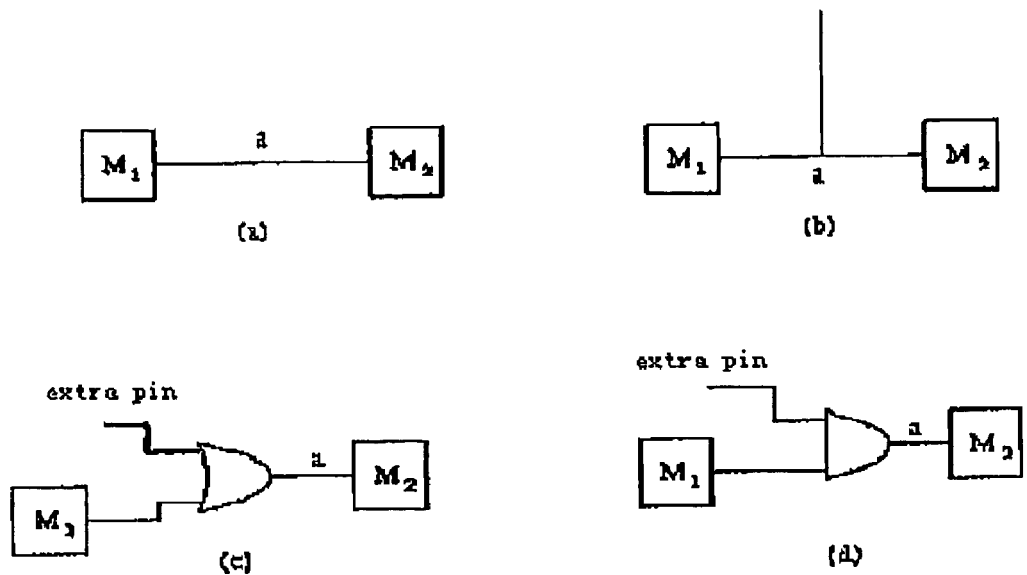
FIG. 1 is a diagram showing a conventional test point structure.
Figure 2:
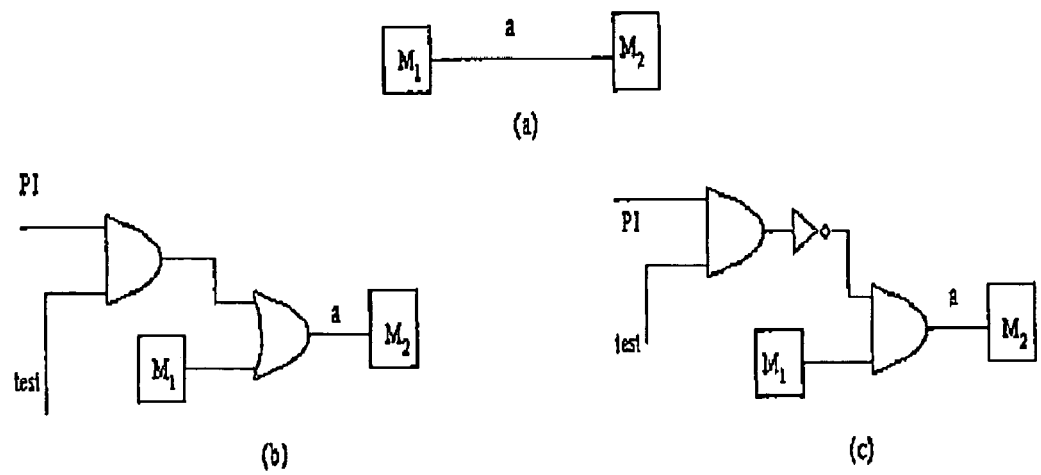
FIG. 2 is a diagram showing test point structure according to one embodiment of the invention.

A method for reducing pin overhead in non-scan design for testability is disclosed. Referring to FIG. 2, FIG. 2(a) shows an original circuit; FIG. 2(b) shows insertion of 1-control point; and FIG. 2(c) shows insertion of 0-control point.

Figure 3:
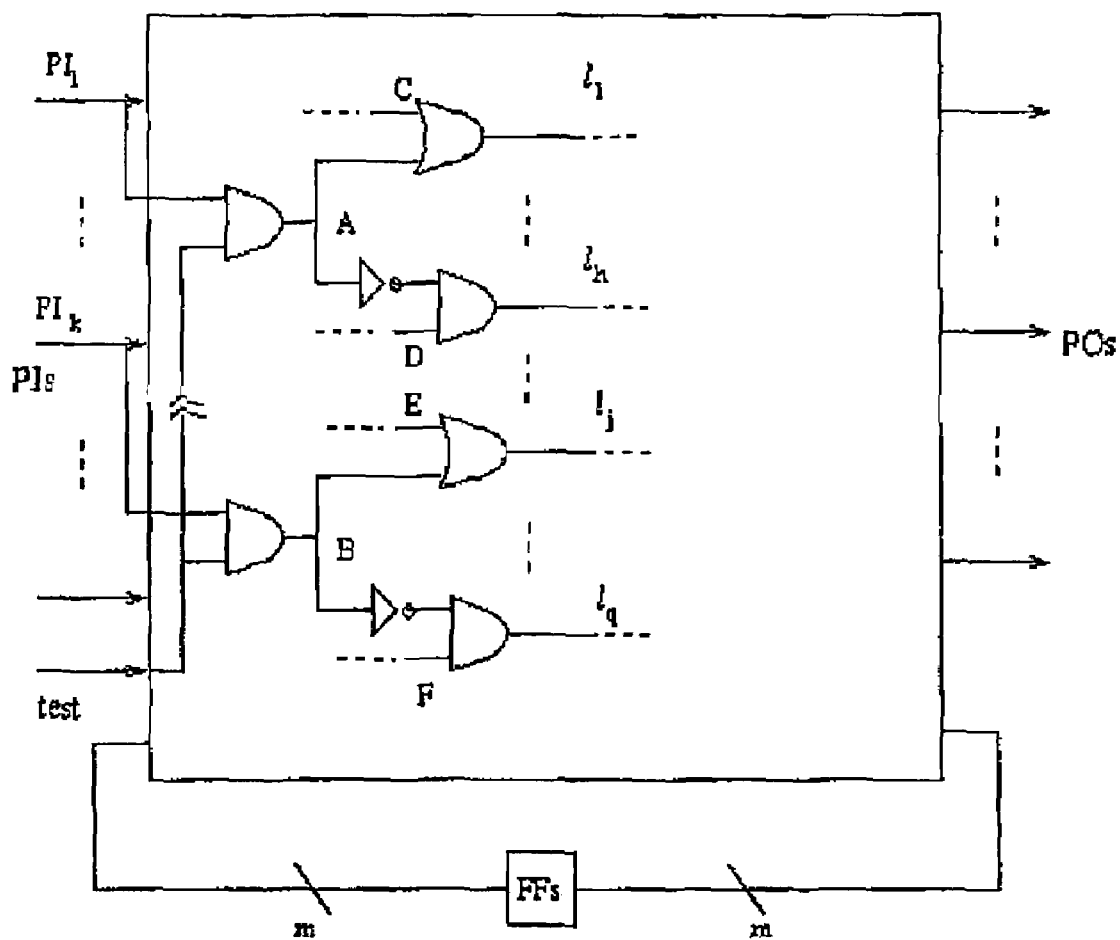
FIG. 3 is a diagram showing low-cost non-scan design for testability according to another embodiment of the invention.

In one embodiment, FIG. 3 shows a low-cost non-scan design for testability. Typically, the control signals of test points $l_1 \sim lh$ are connected to primary input $PI_1$, and the control signals of test points $l_j \sim l_q$ are connected to primary input $PI_k$. Every test point l is connected to a primary input (PI) by a AND gate. 1-controllable point $l_1$ is connected to the AND gate directly; 0-controllable point $1_h$ is connected to the AND gate by an inverter. All controllable points that are connected to the same PI share a single AND gate and all controllable points are controlled by a universal test signal. $PO_S$ in FIG. 3 are the outputs of multiple inputs signature register (MISR).

The guiding principle of the pin overhead reduction method is that the control signals of test points are reduced at the furthest while avoiding generating new undetectable faults, in particular, the control signal of test points are connected to the primary input which with the control line that doesn't produce a new re-convergent fan-out. It is quite possible for a new re-convergent fan-out to generate new undetectable faults.

Figure 4:
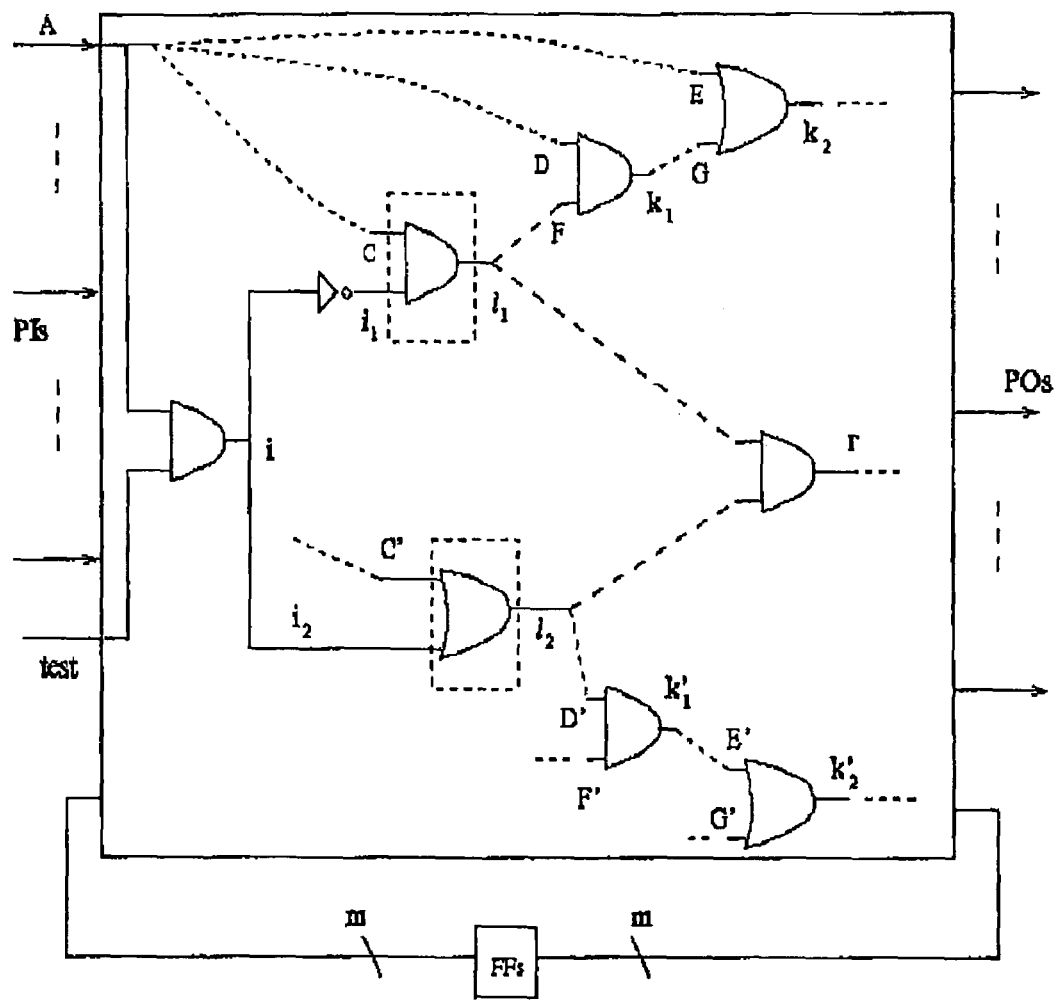
FIG. 4 is a diagram showing avoiding conflicts incurred by signal verification according to another embodiment of the invention.

FIG. 4 illustrates how to avoid the conflicts incurred by signal requirements. As shown in FIG. 4, a 0-control point is inserted into signal line $l_1$, and a 1-control point is inserted into signal line $l_2$. In one embodiment, 0-control points situation is considered, and the situation for 1-control points is similar. Referring to FIG. 4, line C is directly controllable by the primary input, and the fan-out branches re-converge at the following 3 positions: the branches of fan-out PI re-converge at $l_1$; line $l_1$ and PI re-converge at $K_1$ and $K_2$; line $l_1$ and line $l_2$ re-converge at line r. To judge whether a re-convergence brings new undetectable faults, we should check whether the sequential delays of its fan-out branches are equal or not: if they are not, new undetectable faults will not occur; if they are, the inversion parities of different branches should be checked. The inversion parity of a path is defined as the remainder when the number of inversions in the path divided by 2. The inversion parity between line 1 and line s, $inv_v(l, s)$, is defined as a two-binary-bit number. If there is no path between the two lines, the inversion parity is equal to 00, that is to say, $inv_0(l, s)=00$, in this case, new undetectable faults will not occur.

Figure 5:
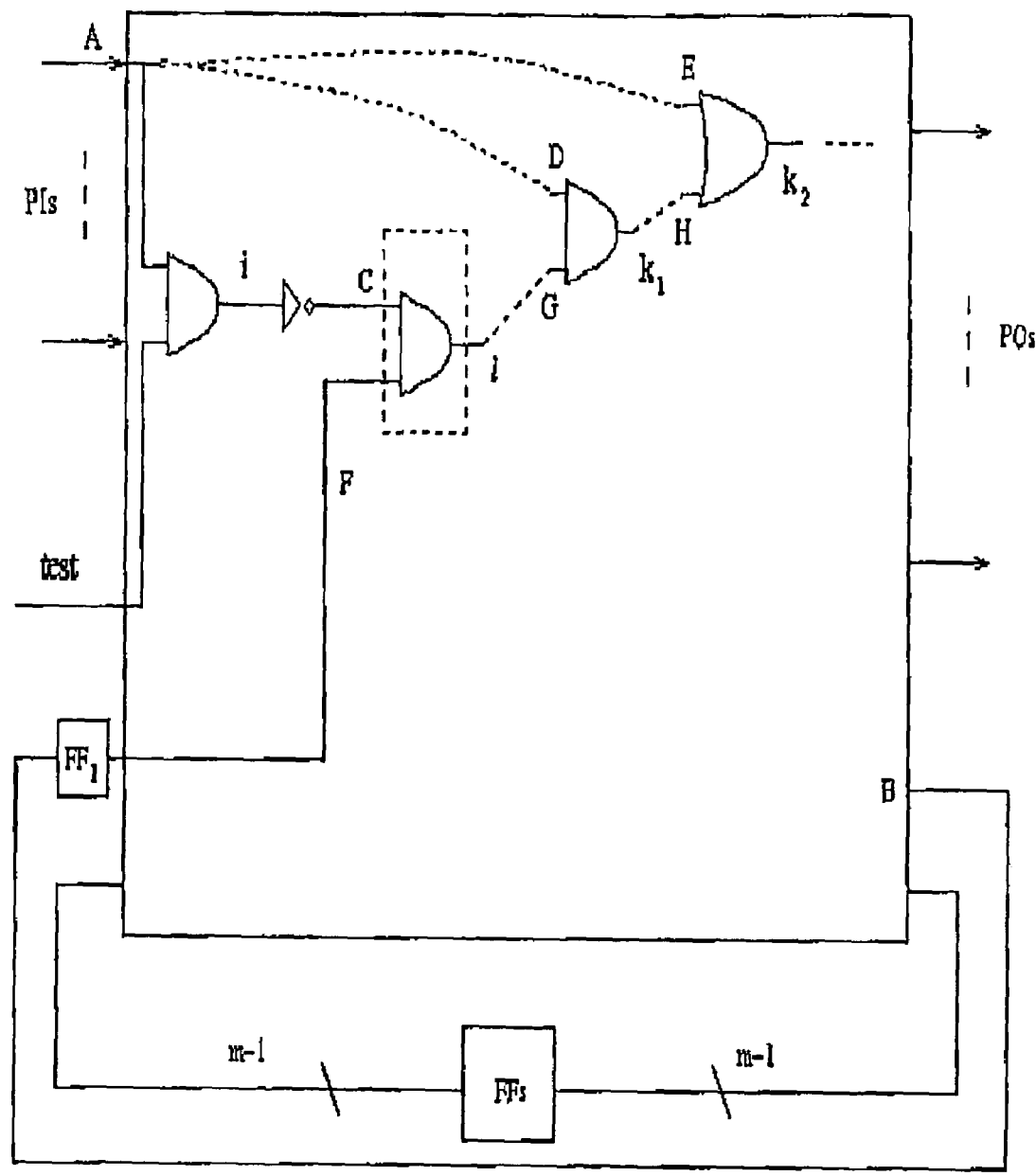
FIG. 5 is a diagram showing connect reset signal to primary input according to another embodiment of the invention.

The method stated above can also be used to handle the connection and share of reset signals in partial reset design. In partial reset design, the reset signals are all inserted into the outputs of flip-flops. Referring to FIG. 5, supposing B is directly reachable from a PI, then we connect the reset signal of line 1 to PI, which makes the fan-out branches of PI re-converge at line l. This re-convergence does not bring any conflict, because the delay from PI to C and the delay from PI to F(suppose F is reachable from PI) are not equal. Similarly, if 1 and PI re-converge at $k_1$ and $k_2$, we should check whether there are any conflict with the rules stated above. The observation points are connected to multiple XOR trees (the maximal number is 20), the output of all XOR trees are connected to a multiple input signature register which has only one output pin. Thus it can be seen that the extra pin overhead is reduced to 2 by this invention.

The following algorithm illustrates how to connect the control signal of a control point to PIs of circuit. Using the same method, we can connect multiple control signals to one PI. This algorithm needs a circuit description file that includes information of line index, gate type, predecessor table and successor table and test point set $\{T_1, T_2, \ldots, T_t\}$. The output result of the algorithm is a circuit after design for testability which has only two extra pins: one is the test signal that controls all control points, the other is the output of multiple inputs signature register (MISR).

Algorithm (Connect All Test Points to PI)

1. set i and j to be the subscripts of test point and PI, respectively, and $i \leftarrow 1, j \leftarrow 1$, n is the number of PIs;

2. While($j \leq n$),do
  (1) Call function converge ($T_i$, $PI_j$) to judge if test point $T_i$ and $PI_j$ re-converge;
  (2) If $T_i$ and $PI_j$ do not converge, connect the control signal of $T_i$ to $PI_j$, and modify the circuit structure: add $T_i$ into the successor table of $PI_j$, and add $PI_j$ into the predecessor table of $T_i$, and let $j \leftarrow n+1$; if they converge, do (3);
  (3) $j \leftarrow j+1$.

3. $j \leftarrow 1$; While($j \leq n$),do
  (1) Call function converge($T_i$, $PI_j$) to find out the converge point set of $T_i$ and $PI_j$:$\{R_1, R_2, \ldots, R_k\}$. For any converge point R, suppose its input signals are a and b, and a is reachable from $T_i$, b is reachable from $PI_j$. If R is a AND gate or a NAND gate as well as $seq_1(T_i, a) \neq seq_1(PI_j, b)$, or if R is a OR gate or NOR gate as well as $seq_0(T_i, a) \neq seq_0(PI_j, b)$, then connect control signal of $T_i$ to $PI_j$; otherwise do (2);
  (2) If R is a AND gate or a NAND gate and either of $inv_1(T_i, a)$ and $inv_1(PI_j, b)$ is 0, or if R is a OR gate or a NOR gate and either of $inv_0(T_i, a)$ and $inv_0(PI_j, b)$ is 0, then connect control signal of $T_i$ to $PI_j$.
  (3) If control signal of $T_i$ has already been connected to $PI_j$, modify the circuit structure as stated in step (2), $j \leftarrow j+1$.

4. If $i<t$, $i \leftarrow i+1, j \leftarrow 1$, go to step 2;

5. Output all the PIs and their corresponding test points, and return the set of test points that cannot be connected to any PI.

Converge (a, b) /*Function to Find Out All Convergent Points of a and b*/

1. Put all direct successors of a into stack Q and tag every signal line that has been put into Q.

2. When Q is not empty, take an element v from Q and check all of its successors. If successor $v_1$ has no tag, tag it and put it into Q.

3. Find out all direct and indirect successors of b in the same way. If a successor v has been checked in step 1 and 2, put it into set C.

4. Return all signal lines in set C as convergent points of a and b, if C is empty, return a value that denotes a and b do not converge.

Reach(a, b) /* Judge if b is Reachable From a*/

1. Put all immediate successors of a into stack Q and flag every signal line that has been put into Q. If b is one of them, return a value that denotes b is reachable from a. Otherwise go to 2.

2. If Q is not empty, pop an element v from Q and check all successors of v. If one successor $v_1$ has no flag, add it into Q and flag it. If $v_1$ is b, return a value that denotes b is reachable from a.

3. Return a value that denotes b is not reachable from a.

Figure 6:
FIG. 6 is a diagram showing the change of the circuit caused by connecting test point $T_i$ to input $PI_j$ according to another embodiment of the invention.
Figure 6:
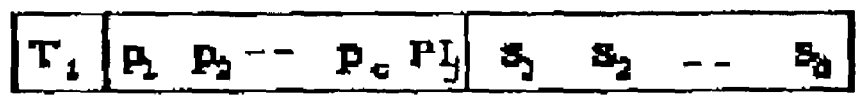
Figure 6:
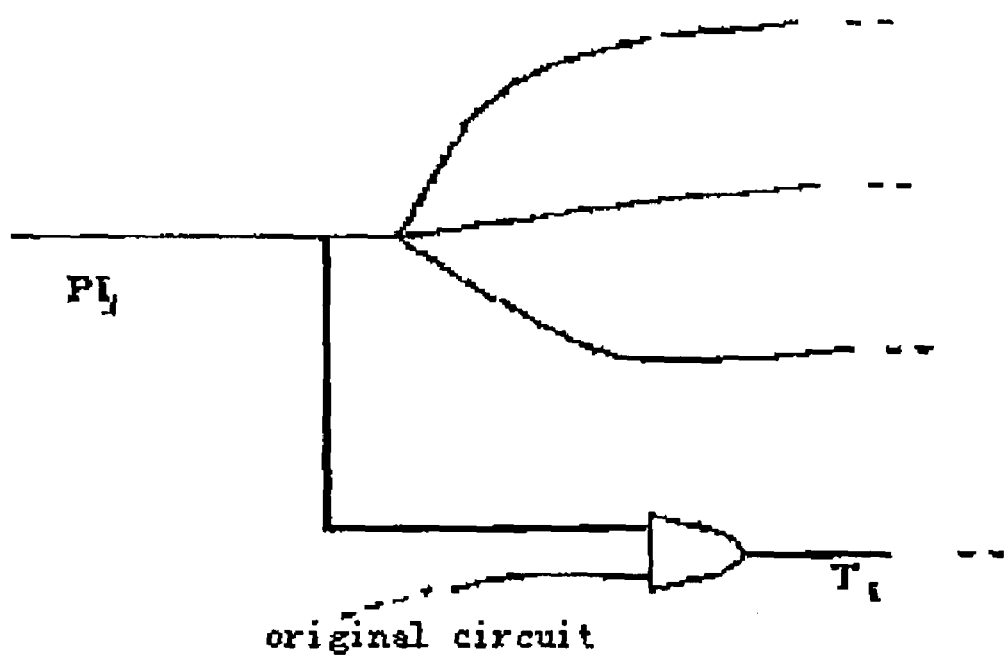

Now referring to FIG. 6, $PI_j$ has successors $S_1, S_2, \ldots, S_b$, test point $T_i$ has predecessors $P_1, P_2, \ldots, P_c$ and successors $S_1, S_2, \ldots, S_d$. When control signal of test point $T_i$ is connected to $PI_j$, $T_i$ is added into the successor table of $PI_j$, and $PI_j$ is added into predecessor table of $T_i$.

Figure 7:
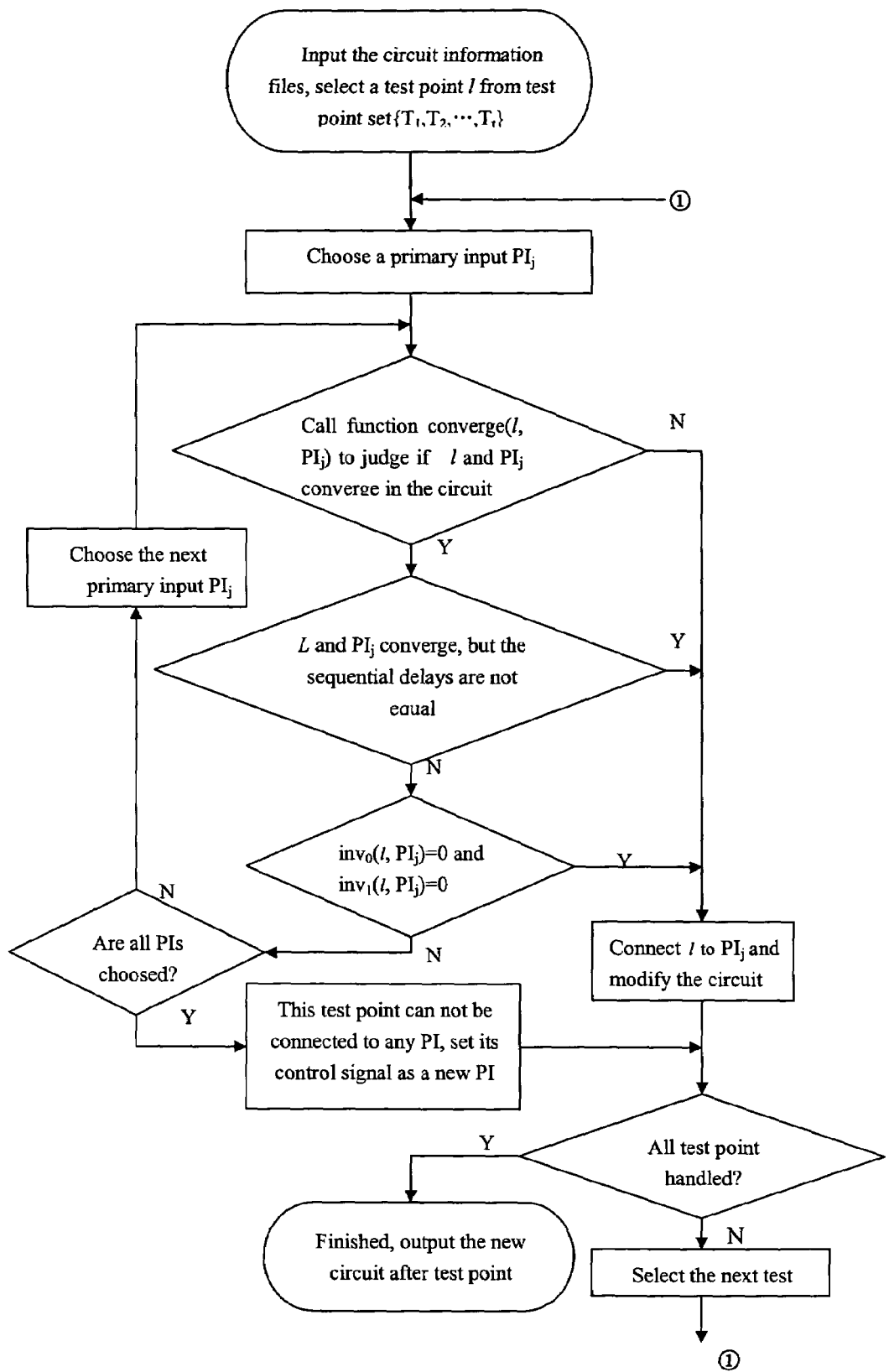
FIG. 7 is a flowchart of showing connecting control points to primary inputs according to another embodiment of the invention.

FIG. 7 is a flowchart of showing connecting control points to primary inputs according to another embodiment of the invention. Two efficient measures (sequential depth for testability and inversion parity) help to connect the control signals of control points to PIs. As shown in FIG. 7, to judge if a PI and 1 converge, for every successor of 1, we must check the inversion parity from this PI to it. If the inversion parity from PI to every successor of l is 00, we can conclude that l and PI do not converge. In the same way, we can judge if one signal line is reachable from another signal line. When we check the sequential delay for testability of a re-convergent fan-out at l', the following technique can be used: Let l'have inputs a and b, and l'is the output of a AND or NAND gate (or a OR or NOR gate). If $seq_1(a, PI) \neq seq_1(b, PI)$ (or $seq_0(a, PI) \neq seq_0(b, PI)$), a re-convergent fan-out with non-uniform inversion parity. As shown in FIG. 4, the following scheme can be used to check whether the sequential delay for testability between the primary input A and the test point l: check whether $seq_1(l, PI)=0$ if a o-control point is inserted into l; check whether $seq_0(l, PI)=0$ if a 1-control point is inserted into l. The following scheme can be used to check whether l and PI generate a re-convergent fan-out with the uniform inversion parity: Let PI and l re-converge at an AND gate $k_1$ (or an OR gate $k_2$ as shown in FIG. 4), $k_1$ has inputs D and F (or $k_2$ has inputs E and G), if $inv_1(D, PI)=inv_1(F, PI)$ (or $inv_0(E, PI)=inv_0(G, PI)$), and both of them are not 11, the re-convergent fan-out has uniform inversion parity braches.

Figure 8:
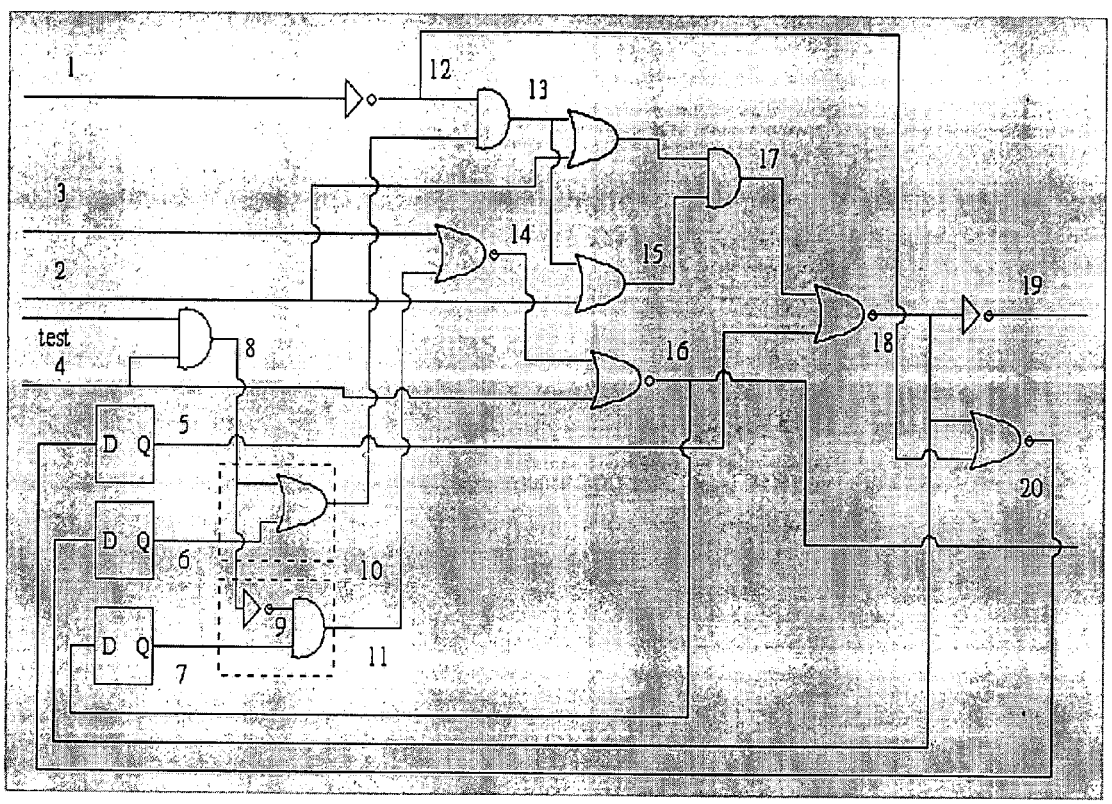
FIG. 8 is a diagram showing connecting multiple control signals to one primary input according to another embodiment of the invention.

Now referring to FIG. 8, two control points are inserted in to signal line 10 and 11 respectively. First, we consider the primary input 4: because line 10 is unreachable from line 4 as well as line 10 and line 4 do not converge, the 1-control point of line 10 is connected to primary input 4; line 11 is also unreachable from line 4, and though they converge at line 16, the re-convergent branches, 4-11-14-16 and 4-16, are inverse compatible, hence the 0-control point of line 11 is connected to primary input 4. Though line 4 and line 11 re-converge at line 16, $inv_0(14,4)=00$, that is to say that signal requirement (14,0) can be performed by (3,1), thus there will not be any new undetectable fault. Test point 10 and test point 11 do not converge in the circuit, thus it doesn't matter that the two test points share primary input 4.

Figure 9:
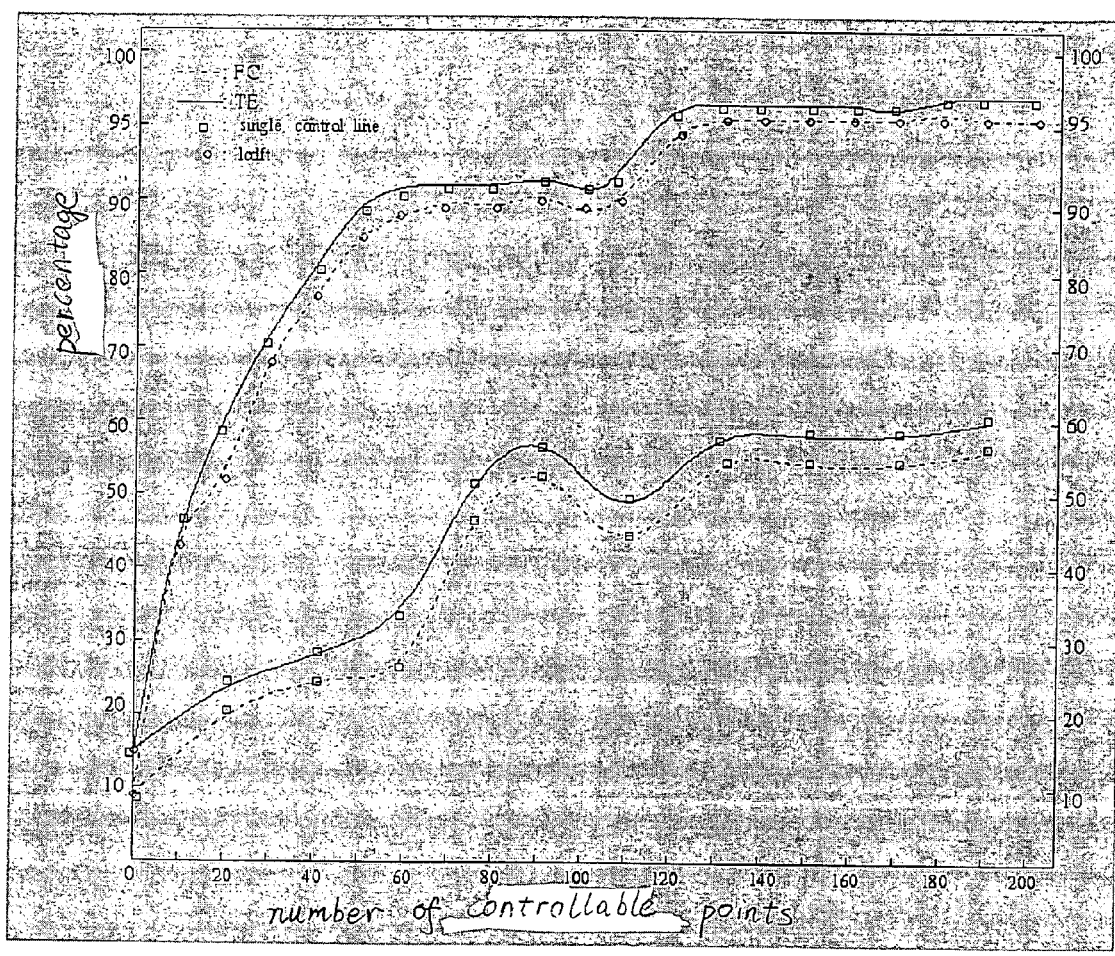
Figure 10:
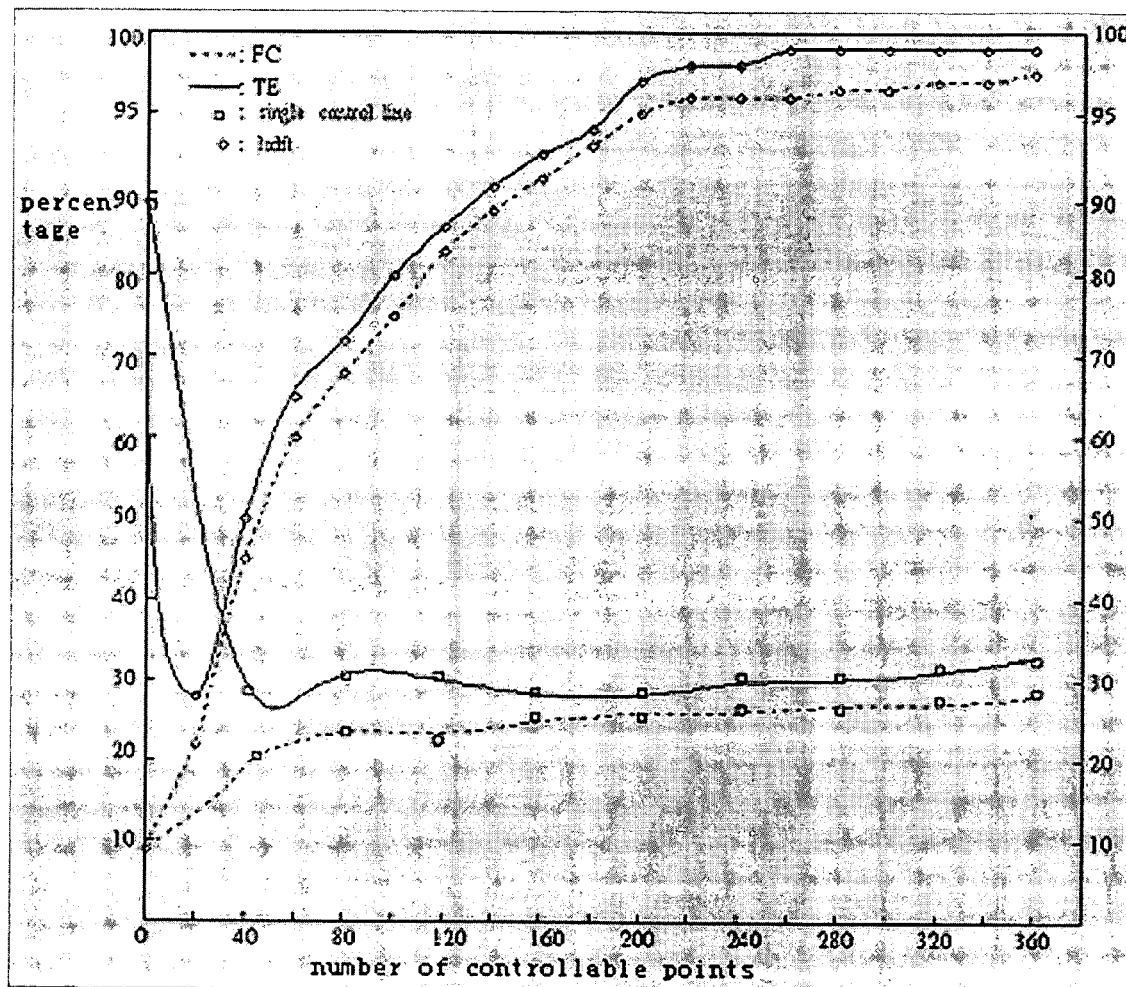

FIG. 9 is a diagram showing improvements on testability of circuit S9234.1 when different test points are inserted in, and FIG. 10 is a diagram showing improvements on testability of circuit S13207.1 when different test points are inserted in. In particular, FIG. 9 shows the relationship between fault coverage and the number of control points inserted in circuit for s9234.1 and FIG. 10 presents results of s13207.1. Both circuits are hard-to-test ones. After using the method in this invention, up to 95% fault coverage for s9234.1 and 97% fault coverage for s13207.1 can be obtained. FIG. 9 and FIG. 10 also present the experimental results using a single control line. As shown in the figures, our invention can get much better fault coverage than the single control line scheme.

Table 1 compares the experimental results of nscan+(the method proposed by this invention) and that of nscan (a recently published efficient tool). As shown in the Table 1, tp, po, FC, TE, vec, cpu and ao denote number of test points, number of extra pins, fault coverage, test efficiency, number of test patterns, CPU time, and area overhead (in percent style). The results in table 1 make it clear that nscan+ is better than nscan almost for all circuits.

Thus, a method for reducing pin overhead in non-scan design for testability has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method for reducing pin overhead in a non-scan design for testability, said method comprising:
    connecting control signals of test points $l_1, l_2, \ldots, l_h$ to a first primary input $PI_1$ through AND gate switch;
    connecting control signals of test points $l_j, \ldots, l_q$ to a kth primary input $PI_k$ through AND gate switch until every test point is connected to either primary inputs $PI_1$, $PI_2, \ldots, PI_k$, where k is no more than n and n is the number of the primary inputs:
    connecting a 1-control point to AND gate directly for a 1-control point circuit architecture;
    connecting a 0-control point to AND gate through inverter 0-control point circuit architecture;
    sharing one AND gate among all control points that are connected to the same primary input;
    controlling all control points by an uniform signal test; and
    checking whether the test points and the primary inputs produce new re-convergent fan-out while reducing inputs of the control signals;
    wherein the checking stop comprises:
        setting parameters to describe a circuit architecture, said parameters including number, type, predecessor table and successor table of each signal line l, wherein for test point set $\{l_1, l_2, \ldots, l_j\}$, i and j are subscripts of test point $l_j$ and the primary input $PI_j$ respectively;
    the checking step further comprises sub-steps of:
        setting i=1, and j=1 while n≧j;
        calling program converge($l_j$, $PI_j$) to judge whether the test point $l_j$ converges with the primary input $PI_j$;
        putting all direct successors of $l_j$ into a stack Q and marking said direct successors of $l_j$ as visited;

TABLE 1

EXPERIMENTAL RESULTS COMPARED WITH NSCAN ON ISCAS89 CIRCUIT

| | NSCAN | | | | NSCAN+ | | | | |
|---|---|---|---|---|---|---|---|---|---|
| CIRCUIT | TP/PO | FC/TE | VEC | CPU | TP/PO | AO | FC/TE | VEC | CPU |
| s1423 | 40/2 | 93.6/94.5 | 607 | 2132 | 40/2 | 5.3 | 94.1/95.0 | 274 | 2078 |
| s5378 | 60/2 | 97.3/99.5 | 1337 | 6584 | 60/2 | 3.0 | 97.5/99.5 | 2599 | 6695 |
| s9234 | 160/2 | 92.8/95.7 | 3685 | 8045 | 160/2 | 3.2 | 95.4/97.8 | 1760 | 2565 |
| s9234.1 | 160/2 | 90.9/94.8 | 2946 | 9832 | 160/2 | 3.2 | 95.4/97.8 | 1760 | 2635 |
| s13207 | 240/2 | 91.8/94.9 | 3927 | 13488 | 240/2 | 3.6 | 96.3/99.4 | 5044 | 16165 |
| s13207.1 | 240/2 | 91.2/94.5 | 4023 | 15720 | 240/2 | 3.7 | 96.7/99.3 | 5059 | 20795 |
| s15850 | 240/2 | 94.2/97.6 | 8583 | 8441 | 240/2 | 3.3 | 93.2/97.5 | 4007 | 7976 |
| s38417 | 800/2 | 82.8/85.2 | 2271 | 31.8 H | 800/2 | 4.6 | 91.7/93.9 | 5988 | 48829 |
| s38584 | 400/2 | 91.6/94.5 | 8908 | 59757 | 400/2 | 2.6 | 92.6/94.9 | 8820 | 52178 |
| s38584.1 | 400/2 | 91.4/93.8 | 10043 | 63268 | 400/2 | 2.6 | 93.7/96.0 | 11205 | 40439 | popping an element I from the stack Q, and marking all its direct successors that are not visited and put them into the stack Q;

repeating until all elements in the stack Q are checked;

checking all lines that are accessible from $Pl_j$, if one of them is in the stack Q, then putting it into set C; and judging that the lines in set C are the converge points of the test point $l_i$ and $pl_j$, if C is empty, judging that $l_i$ does not converge with $Pl_j$.

2. The method of claim 1, wherein the checking step further comprises:

connecting the control input of test point $l_i$ to $PI_j$ while $n \geq j$ and $l_i$ and $PI_j$ do not converge;

setting i=i+1;

repeating the sub-steps of the claim 1 until $l_t$, were t is the number of test point; and setting j=j+1.

3. The method of claim 2, wherein the checking step further comprises:

setting i=i+1 and j=1 if $i_t>i$, and performing steps of claim 4.

4. The method of claim 3, wherein the checking step further comprises:

outputting all the connection between test points of the control signals and the primary inputs; and outputting the set of the test points of the control signals that can not be connected to any primary input.

5. The method of claim 1, wherein the checking step further comprises:

setting j=1 while $n \geq j$ and if $l_i$ and $PI_j$ converge;

calling converge($l_i$, $PI_j$) to find the converge point set $\{R_1, R_2, \ldots, R_k\}$ of $l_i$ and $P l_j$, and for any converge point R, setting the inputs of R as a and b, wherein a is accessible from $I_i$, and b is accessible from $PI_j$;

connecting the control input of test point $l_i$ to the primary input $PI_j$, if R is an AND gate or a NAND gate and the signal timing delay from a to $l_i$ when R is set to 1 which is expressed as $seq_1(l_i, a)$ is not equal to the signal timing delay from b to $PI_j$ which is expressed as $seq_1(PI_j, b)$, or if R is an OR gate or a NOR gate and the signal timing delay from a to $l_i$ when R is set to 0 which is expressed as $seq_0(l_i, a)$ is not equal to the signal timing delay from b to $PI_j$ which is expressed as $seq_0(l_i, a)$, otherwise;

connecting the control input of test point $l_i$ to the primary input $PI_j$, if R is an AND gate or a NAND gate and either the inversion parity from a to $l_i$ when R is set to 1 which is expressed as $inv_1(l_i, a)$ or the inversion parity from b to $PI_j$ when R is set to 1 which is expressed as $inv_1(PI_j, b)$ is equal to the value of 0, or if R is an OR gate or a NOR gate and either the inversion parity from a to $l_i$ when R is set to 0 which is expressed as $inv_0(l_i, a)$ or the inversion parity from b to $PI_j$ when R is set to 1 which is expressed as $inv_0(PI_j, b)$ is equal to the value of 0, and setting j=j+1 if the control input of $l_i$ has been connected to $PI_j$.

6. The method of claim 1, wherein the 1-control point architecture includes one AND gate and one OR gate, the inputs of the AND gate are one primary input and the uniform test signal, the inputs of the OR gate are the output of the AND gate and the output of circuit $M_1$, and the output of the OR gate is the input of circuit $M_2$.

7. The method of claim 1, wherein the 0-control point architecture includes a first and a second AND gates and one inverter, the inputs of the first AND gate are one primary input and the uniform test signal, the input of the inverter is the output of the first AND gate, the inputs of the second AND gate are the output of the inverter and the output of circuit M1, and the output of the second AND gate is the input of circuit $M_2$.

8. An apparatus for reducing pin overhead in a non-scan design for testability, said apparatus comprising:

means for connecting control signals of test points $l_1, l_2, \ldots, l_h$ to a first primary input $PI_1$ through AND gate switch;

means for connecting control signals of test points $l_j, \ldots, l_q$ to a kth primary input $PL_k$ through AND gate switch until every test point is connected to one of the primary inputs $Pl_1, Pl_2, \ldots, Pl_k$, where k is no more than n and n is the number of the primary input;

means for connecting a 1-control point to AND gate directly for a 1-control point circuit architecture;

means for connecting a 0-control point to AND gate through an inverter for a 0-control point circuit architecture;

means for sharing one AND gate among all control points that are connected to the same primary input;

means for controlling all control points by a uniform test signal; and means for checking whether the test points and the primary inputs produce new re-convergent fan-out while reducing inputs of the control signals;

wherein the means for checking comprises:

means for setting parameters to describe a circuit architecture, said parameters including number, type, predecessor table and successor table of each signal line l, wherein for test point set $\{l_1, l_2, \ldots, l_t\}$, i and j are subscripts of test point $l_i$ and the primary input $PI_j$ respectively;

means for setting i=1, and j=1 while n>j;

means for calling program converge ($l_i$, $PI_j$) to judge whether the test point $l_i$ converges with the primary input $PI_j$;

means for putting all direct successors of $l_1$ into a stack Q and marking said direct successors of $l_i$ as visited;

means for popping an element from the stack Q, and marking all its direct successors that are not visited and put them into the stack Q;

means for repeating until all elements in the stack Q are checked;

means for checking all lines that are accessible from $PI_j$, if one of them is in the stack Q, then putting it into set C; and means for judging that the lines in set C are the converge points of the test point $l_i$ and $PI_j$, if C is empty, judging that $l_i$ does not converge with $PI_j$.

9. The apparatus of claim 8, wherein the 1-control point architecture includes one AND gate and one OR gate, the inputs of the AND gate are one primary input and the uniform test signal, the inputs of the OR gate are the output of the AND gate and the output of circuit $M_1$, and the output of the OR gate is the input of circuit $M_2$.

10. The apparatus of claim 8, wherein the 0-control point architecture includes a first and a second AND gates and one inverter, the inputs of the first AND gate are one primary input and the uniform test signal, the input of the inverter is the output of the first AND gate, the inputs of the second AND gate are the output of the inverter and the output of circuit $M_1$, and the output of the second AND gate is the input of circuit $M_2$.

* * * * *

UNITED STATES PATENT AND TRADEMARK OFFICE
CERTIFICATE OF CORRECTION

PATENT NO. : 7,051,302 B2
APPLICATION NO. : 10/703936
DATED : May 23, 2006
INVENTOR(S) : Xiang et al.

It is certified that error appears in the above-identified patent and that said Letters Patent is hereby corrected as shown below:

On the cover page
In the Abstract, Line 2, delete "," and insert -- . --

Column 6
Line 21, delete "either" and insert -- one of the --
Line 30, delete "signal test" and insert -- test signal --
Lines 40, 62, 63, delete "$Pl_j$" and insert -- $PI_j$ --

Column 7
Lines 5 and 9, delete "$Pl_j$" and insert -- $PI_j$ --
Line 8, delete "$pl_j$" and insert -- $PI_j$ --
Line 15, delete "$1_i$," and insert -- $1_i$, --
Line 20, delete "$i_i>i$" and insert -- $i_i>I$ --
Line 32, delete "$P1_j$" and insert -- $PI_j$ --

Column 8
Line 11, delete "$PL_k$" and insert -- $PI_k$ --
Line 13, delete "$P1_1, Pl_2, \ldots, P1_k$," and insert -- $PI_1, PI_2, \ldots, PI_k$, --
Line 14, delete "input" and insert -- inputs --

Signed and Sealed this

Twenty-first Day of August, 2007

JON W. DUDAS
*Director of the United States Patent and Trademark Office*